United States Patent [19]

Cowen

[11] Patent Number: 5,917,439
[45] Date of Patent: Jun. 29, 1999

[54] SYSTEM FOR HIGH SPEED TRACK ACCESSING OF DISK DRIVE ASSEMBLY

[75] Inventor: Stephen Cowen, Longmont, Colo.

[73] Assignee: Mobile Storage Technology Inc., Boulder, Colo.

[21] Appl. No.: 08/770,446

[22] Filed: Dec. 20, 1996

[51] Int. Cl.$^6$ ........................................ H03M 7/16
[52] U.S. Cl. .................................. 341/96; 360/49
[58] Field of Search ............................ 360/49; 341/95, 341/96, 97, 98

[56] References Cited

U.S. PATENT DOCUMENTS 4,949,200   8/1990   Weng ........................................ 360/72.2
5,072,378  12/1991   Manka ....................................... 395/575
5,369,535  11/1994   Hetzler ...................................... 360/78.14

Primary Examiner—Brian Young
Assistant Examiner—Peguy Jean Pierre
Attorney, Agent, or Firm—Skjerven, Morrill, MacPherson, Franklin & Friel LLP; David W. Heid

[57] ABSTRACT

The address of each track in a disk drive system is expressed in Gray code, and an appended bit of information is added to the Gray code, associated with the least significant bits thereof, the value of which is determined by the values of the most significant bits of the Gray code. The value of this appended bit is the same from Gray code to successive Gray code, as long as there are no changes in any significant bit between successive Gray codes, but the appended bit changes value when there is a change in a most significant bit between successive Gray codes.

4 Claims, 1 Drawing Sheet

SYSTEM FOR HIGH SPEED TRACK ACCESSING OF DISK DRIVE ASSEMBLY

FIELD OF THE INVENTION

This invention relates to disk drives, and more particularly, to a system for accessing data tracks thereof in a rapid manner.

BACKGROUND OF THE INVENTION

As is well known, disk drives are used for the storage of digital data, which is provided in circular tracks on the magnetic surface of a disk. Typically, each such track contains, at predetermined radial locations therealong, an address code which identifies that track. The physical address and servo data for each track to be accessed is written during a previous servo writing operation.

Typically, each track address is expressed in Gray code, rather than conventional binary representation. In Gray code, as a number is incremented, only a single bit of the code changes, while, for example, many bits may change as a conventional binary code number is incremented, as shown in the following example:

| decimal track no. | conventional binary code | Gray code |
|---|---|---|
| track 7 | 0111 | 0100 |
| track 8 | 1000 | 1100 |

As seen in this example, all four bits of the conventional binary code change as the code is incremented from decimal 7 to decimal 8, while in Gray code only a single bit changes when going from decimal 7 to decimal 8.

Thus, if conventional binary code were to be used, an erroneous or misdetected bit reading could give an erroneous value which could result in a serious track reading error.

As the heads move toward a chosen track to read or write data thereon, track addresses are read so that the location of the heads can be determined as they move toward the chosen track. Then, based on this information, the distance to the target track and velocity of the heads are computed.

Gray code information is used by the servo system in two modes; seek mode and track following mode. In track following mode the disk drive may read or write data to a specific target track. During this mode the head is positioned over the center line of the target track. The track address is decoded and used to verify that the heads are positioned on the correct track. Since no address bits are expected to change, any binary code sufficient in length to define the number of tracks unambiguously is satisfactory. For example, 12 bits of information in Gray code would allow 4096 track addresses.

During the seek mode, heads are moving rapidly in a radial direction from a first track to a target or destination track in order to access data on another portion of the disk. It is desirable to accomplish this task as quickly as possible to avoid unnecessary delays in providing data to the host computer. In seek mode a track address is read to determine head location, and is used to compute the distance to the target track as well as radial velocity of the heads. The accuracy and time of the seek operation depends on the accuracy with which instantaneous track address information can be decoded.

Errors in determining velocity and/or position affect the overall time to data because in such case the actuator velocity will not be optimum, i.e., seek velocity will either be higher or lower than optimum. If velocity is lower than optimum then the seek operation will take longer than needed. If such a state happens randomly, seek specifications will need to be changed to reflect occasional slower seeks. If velocity is higher than optimum, especially near the end of a seek operation, the actuator may over shoot the track with highly undesirable effects.

As the heads are moving toward the target track, they may be positioned over a boundary of two tracks during the period when the track address is being read. In this case the heads may read bits from one track address or the other in any combination. Had the addresses been encoded in conventional binary form, serious decoding errors could occur as shown in the following example:

| | conventional binary code | decimal |
|---|---|---|
| bit number | 7 6 5 4 3 2 1 0 | |
| track 31 | 0 0 0 1 1 1 1 1 | 31 |
| track 32 | 0 0 1 0 0 0 0 0 | 32 |
| detected address value | 0 0 0 0 0 1 0 1 | 05 |
| track error | | 26 |

In this example, bits 7, 6, 5, 2 and 0 (underlined above) are read from track 31, while bits 4, 3 and 1 (underlined above) are read from track 32, as shown in "detected address value". When decoded the address will be read as track 5, an error of 26 tracks.

In comparison, using the same read bit pattern with Gray code, an error of only one track would have occurred:

| | Gray code | decimal |
|---|---|---|
| bit number | 7 6 5 4 3 2 1 0 | |
| track 31 | 0 0 0 1 0 0 0 0 | 31 |
| track 32 | 0 0 1 1 0 0 0 0 | 32 |
| read address | 0 0 0 1 0 0 0 0 | 31 |
| track error | | 1 |

Based on the assumption that data from no more than two track addresses will be read, servo systems have been developed using supplementary servo patterns which can be used to detect and correct track position when a track is found to be at an unexpected odd or even position error condition. Information is derived from the patterns indicating the magnitude and direction of the error.

The assumption that an error will not exceed a single track is valid as long as the heads do not cross more than one track boundary while an address is being read. Operationally, this assumption has been practical for previous disk drives. However, modern high performance disk drives have tracks that are much closer together than in the past, and much faster track seeking servo systems are used. Furthermore, the increased number of tracks on a disk surface has tended to increase the number of bits of Gray code required to be read in each track information burst, which reading normally takes place at fixed intervals of time. The combination of these factors has created disk drives which, during seek, may cause the heads to cross more than one track boundary so that partial Gray code addresses from several tracks may be read.

When multiple tracks are crossed during address reading, a complete Gray code of a track cannot be read because of the very fast movement of the head toward the target track.

Citements from several tracks would be combined to obtain a complete "detected address value" which may have more than a single bit in error. In such a case, the fact that one of the most significant bits had changed during the accessing operation would not have been detected because the read heads might have already advanced past the location where the bit changed, and the least significant bit pattern would be misinterpreted to imply an incorrect track address. Based on this incorrect reading, recovery correction necessary to appropriately reach the target track would not be achieved.

In explaining this, reference is made to Table 1 below, wherein decimal track numbers and their corresponding Gray codes are set forth, with each Gray code arranged from left to right from most significant bits to least significant bits.

As shown in the flow chart of FIG. 1, the process starts in block 11. The GRAY code address and the appended bit are read in block 12 and then converted to a binary track address in block 13. If the appended bit from block 13 is the expected one, as determined by comparison block 14, the operation is ended at block 16.

If the comparison results is negative, indicating that the appended bit was not as expected, block 17 is entered to determine the proper track address, block 18 is entered and the corrected address is calculated using the algorithm shown, and the operation ends at block 16.

If the operation in block 17 indicates an outward seek is required, the operation enters block 19 to calculate the correct track address using the algorithm shown, and the operation ends.

TABLE I

| Decimal Track No. | Gray Code<br>MSB ← → LSB |
|---|---|
| 500 | 0100001110 |
| 501 | 0100001111 |
| 502 | 0100001101 |
| 503 | 0100001100 |
| 504 | 0100000100 |
| 505 | 0100000101 |
| 506 | 0100000111 |
| 507 | 0100000110 |
| 508 | 0100000010 |
| 509 | 0100000011 |
| 510 | 0100000001 |
| 511 | 0100000000 |
| 512 | 1100000000 |
| 513 | 1100000001 |
| 514 | 1100000011 |
| 515 | 1100000010 |
| 516 | 1100000110 |
| 517 | 1100000111 |
| 518 | 1100000101 |
| 519 | 1100000100 |
| 520 | 1100001100 |
| 521 | 1100001101 |
| 522 | 1100001111 |
| 523 | 1100001110 |

During a seek in operation, the heads may at random read several significant bits from decimal track 511, for example 010, and may read bits from tracks 512, 513, 514 and/or 515, all zeros. Then, the head may read the least significant bits 110 of the track 516. The Gray code thus read is 0100000110, indicating decimal track 507, when the heads are actually positioned at track 516, having read the last bits of the address (110) therefrom, an error of 9 tracks.

Errors of this type have serious consequences for the servo system computation resulting in inaccurate velocity and trajectory calculations in attempting to reach the target track. In some cases a seek failure could occur requiring additional time-consuming corrective operations to be initiated.

SUMMARY OF THE INVENTION

In the present track addressing system, each track has an address expressed in Gray code, including a plurality of most significant bits and a plurality of least significant bits. An appended bit is associated with the least significant bits of each Gray code, the value thereof being determined by the value of the most significant bits of the associated Gray code as follows: the value of the appended bit for each successive Gray code remains the same provided no most significant bit changes. Upon a change in a most significant bit from one Gray code to the next successive Gray code, the appended bit changes and remains in such changed state for successive Gray codes as long as there is no change in any most significant bit. Again, when a most significant bit changes from one Gray code to the next successive Gray code, the appended bit changes in value, etc. Then, if an address is read which is made up of parts of Gray codes, the reading of the appended bit value indicates whether there has been a change in a most significant bit during the address reading operation.

BRIEF BESCRIPTION OF THE DRAWINGS

FIG. 1 is a flow chart illustrating the operation of the invention.

DESCRIPTION OF THE PREFERRED EMBODIMENT

Figure 1:
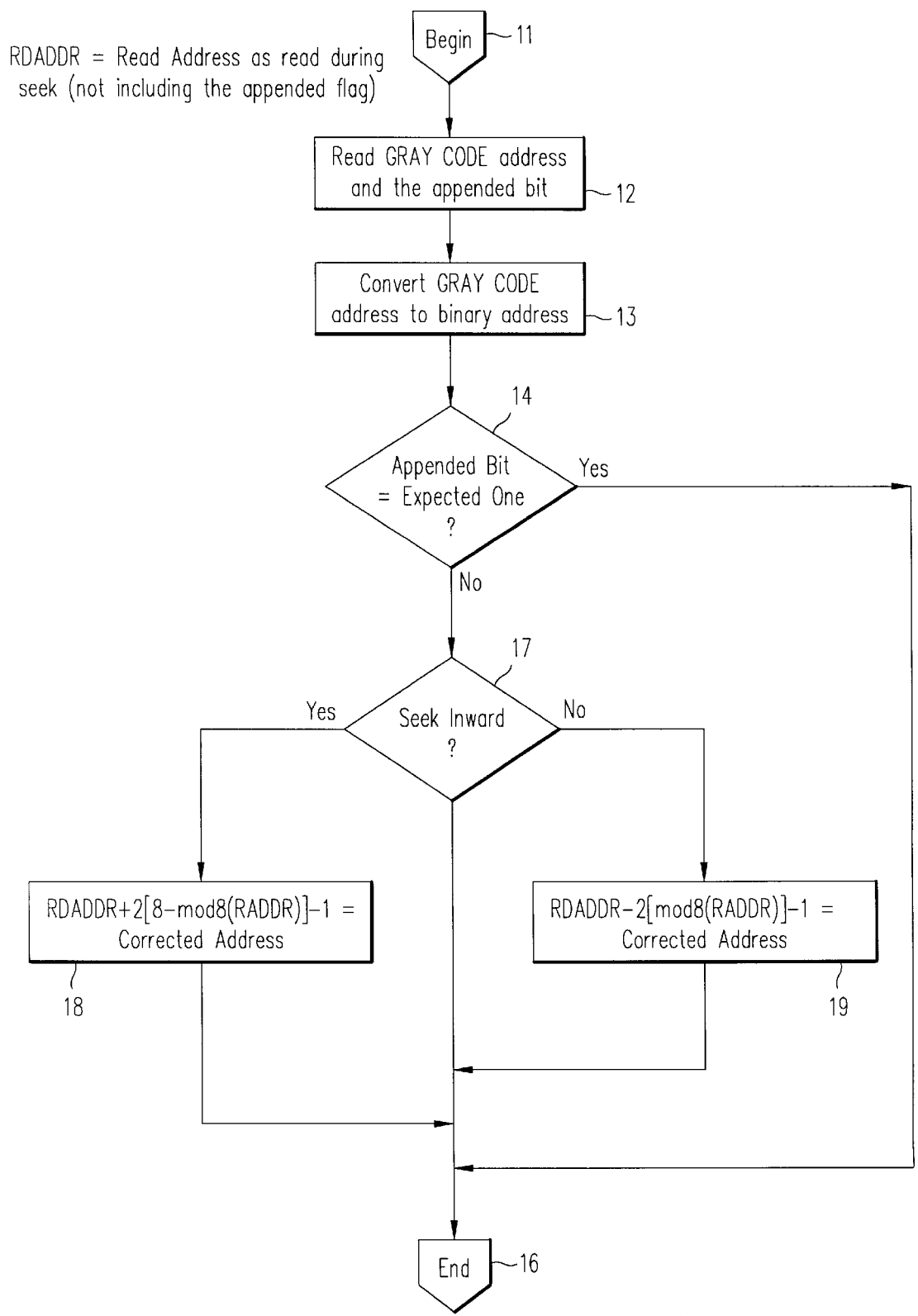

Reference is made to FIG. 1 and Table II below in describing the preferred embodiment of the invention. As shown in the flow chart of FIG. 1, the process starts in block 11. The GRAY code address and the appended bit are read in block 12 and then converted to a binary track address in block 13. If the appended bit from block 13 is the expected one, as determined by comparison block 14, the operation is ended at block 16. If the comparison result is negative, indicating that the appended bit was not as expected, block 17 is entered to determine the proper track address. If block 17 indicates an inward seek is required to reach the proper track address, block 18 is entered and the corrected address is calculated using the algorithm shown, and the operation ends at block 16. The operation RDADDR consistes of reading the address as read during a seek, but not including the appended flag. If the operation in block 17 indicates an outward seek is required, the operation enters block 19 to calculate the correct track address using the algorithm shown, and the operation ends.

TABLE II

| Decimal Track No. | Gray Code<br>MSB LSB | Appended<br>Flag<br>bit |
|---|---|---|
| 500 | 0100001110 | 0 |
| 501 | 0100001111 | 0 |
| 502 | 0100001101 | 0 |
| 503 | 0100001100 | 0 |
| 504 | 0100000100 | 1 |
| 505 | 0100000101 | 1 |
| 506 | 0100000111 | 1 |
| 507 | 0100000110 | 1 |
| 508 | 0100000010 | 1 |
| 509 | 0100000011 | 1 |

TABLE II-continued

| Decimal Track No. | Gray Code<br>MSB    LSB | Appended<br>Flag<br>bit |
|---|---|---|
| 510 | 0100000001 | 1 |
| 511 | 0100000000 | 1 |
| 512 | 1100000000 | 0 |
| 513 | 1100000001 | 0 |
| 514 | 1100000011 | 0 |
| 515 | 1100000010 | 0 |
| 516 | 1100000110 | 0 |
| 517 | 1100000111 | 0 |
| 518 | 1100000101 | 0 |
| 519 | 1100000100 | 0 |
| 520 | 1100001100 | 1 |
| 521 | 1100001101 | 1 |
| 522 | 1100001111 | 1 |
| 523 | 1100001110 | 1 |

A series of decimal track numbers are shown with their corresponding Gray codes, similar to Table I. Each Gray code is divided into a least significant bit group and a most significant bit group. The number of least significant bits n of each Gray code is determined by the maximum number of track crossings N anticipated by the heads during an address, using the formula $2^n \geq N$. For example, the number of least significant bits would be three if the number of tracks crossed would not exceed eight during an address read.

The remainder of the Gray code bits are placed in the most significant bit group, and an appended flag bit (shown to the right of each Gray code) is derived from the state of the most significant bits. The appended bit is derived as follows: choosing for example an appended bit of 0 for the Gray code corresponding to decimal 500, the value of the appended bit remains the same for each successive Gray code as long as no most significant bit changes. Upon a change in a most significant bit, the appended bit changes and remains in that state for all successive Gray codes until a most significant bit changes, etc.

Using the example above and again with reference to Table II, as the heads are moving inward toward the target track, they may move across a number of tracks as a track address is being read. In such case, the heads may at random read significant bits from a series of tracks, repeating the example above. For example, significant bits 010 may be read from decimal track 511, while other significant bits of 0 may be read from decimal tracks 512, 513, 514, and/or 515, with least significant bits 110 being read from track 516. The Gray code address obtained will be 0100000110, indicating decimal track 507, an error of 9 tracks, all as described above.

However, Gray code address 0100000110 is accompanied by an appended bit 1, and yet, an appended bit of 0 is read. This indicates that a most significant bit has changed during the address read. Because expected changes in most significant bits would be known in this range of Gray codes, the actual most significant bits can be determined. Knowing that a most significant bit has changed, the correct address can be determined as decimal track 516, because with Gray code, a block of least significant bits on one side of an appended bit change has a mirror image relationship with a block of least significant bits on the other side of the appended bit change.

Then, once the correct Gray code address is known, this information can be used to recalculate trajectory of the head as it moves toward the target track.

Using the pended value, the address can be corrected by calculating the offset from the next least significant bit boundary, by reading the apparent address and calculating the distance from the boundary in the direction of travel. For the case of inward seek:

MSB_Corrected=MSB_Read+2[8-mod$_8$ (MSB_Read)]-1 where MSB=most significant bits

MSB_Read=actual MSB pattern read during seek

MSB_Corrected=true address of track where least significant bits are read.

In another example, as the heads sweep across a number of tracks to read Gray code of 0100000100, indicating a decimal track address of 504, an appended bit of 1 would be expected. However, because the heads have read least significant bits 100 from track 519, an appended bit of zero is read, indicating that a most significant bit has changed. Thus, the corrected address is decimal track 519.

The above examples have been given for a seek in situation (decimal track numbers increasing). A like process is undertaken to determine the correct track address being read in the seek out situation (decimal track numbers decreasing) as will now be described.

Again with reference to Table II, as the heads are moving outward toward the target track, they may move across a number of tracks as a track address is being read. For example, most significant bits 110 may be read from decimal track 515 while other most significant bits 0 may be read from decimal tracks 514, 513, 512 and/or 511, with least significant bits 001 being read from track 510. The Gray code address obtained will be 1100000001, indicating decimal track 513, an error of three tracks, all as described above.

However, Gray code address 1100000001 is accompanied by appended bit 0, and yet, an appended bit of 1 is expected. This indicates that a most significant bit has changed during the address read. Thus, the corrected address is decimal track 510.

For the case of an outward seek:

MSB_Corrected=MSB_Read-2 [8-mod$_8$ (MSB_Read)]-1 where MSB=most significant bits

MSB_Read=actual MSB pattern read during seek

MSB_Corrected=true address of track where least significant bits are read.

Again, the information is used to recalculate speed and trajectory of the heads as they move toward the target track.

What is claimed is:

1. In a disk drive system having a plurality of tracks on a disk a track address system comprising an address expressed in Gray code associated with each track each such Gray code being made up of a plurality of most significant bits and a plurality of least significant bits, and an appended bit associated with the least significant bits of each Gray code, the value of the appended bit being determined by the value of the most significant bits of the associated Gray code, wherein, in a series of successive Gray codes corresponding to a series of successive tracks, a change in a most significant bit from one Gray code to a next successive Gray code determines a change in the value of the respective appended bits associated therein.

2. In a disk drive system having a plurality of tracks on a disk, a track address system comprising an address expressed in Gray code associated with each track, each such Gray code being made up of a plurality of most significant bits and a plurality of least significant bits, and an appended bit associated with the least significant bits of each Gray code, the value of the appended bit being determined by the value of the most significant bits of the associated Gray code, wherein in a series of successive Gray codes corresponding to a series of successive tracks, in the situation wherein the most significant bits of successive Gray codes are unchanged, the respective appended bits associated with such successive Gray codes are also unchanged.

3. A method of reading an address in a disk drive system wherein a head of a disk drive system may cross a plurality of tracks while so reading said address, wherein each such track has an address expressed in Gray code, wherein each such Gray code is made up in a plurality of most significant bits and a plurality of least significant bits, comprising:

reading a plurality of most significant bits which may be made up of most significant bits of addresses of different tracks;

reading a plurality of least significant bits which may be made up of least significant bits of addresses of different tracks; and determining if any of the most significant bits has changed during such reading.

4. The method of claim 3 wherein the step of determining if any of the most significant bits has changed during such reading is undertaken by reading an appended bit associated with the least significant bits of a Gray code.

* * * * *